US010230300B2

(12) United States Patent
Yu et al.

(10) Patent No.: US 10,230,300 B2
(45) Date of Patent: Mar. 12, 2019

(54) POWER CONVERTER PREDRIVER SYSTEM WITH MULTIPLE POWER MODES

(71) Applicant: Cirrus Logic International Semiconductor Ltd., Edinburgh (GB)

(72) Inventors: Jingjing Yu, Austin, TX (US); Christian Larsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/497,010

(22) Filed: Apr. 25, 2017

(65) Prior Publication Data

US 2018/0309361 A1 Oct. 25, 2018

(51) Int. Cl.
| | |
|---|---|
| *G05F 1/56* | (2006.01) |
| *H02M 3/158* | (2006.01) |
| *H02M 3/02* | (2006.01) |
| *H02M 7/538* | (2007.01) |
| *H03K 19/0185* | (2006.01) |
| *H02M 1/08* | (2006.01) |
| *H02M 1/00* | (2006.01) |
| *H02M 3/155* | (2006.01) |

(52) U.S. Cl.
CPC .............. *H02M 3/02* (2013.01); *H02M 3/158* (2013.01); *H02M 7/538* (2013.01); *H03K 19/018514* (2013.01); *H02M 1/08* (2013.01); *H02M 2001/0006* (2013.01); *H02M 2001/0032* (2013.01); *H02M 2003/1552* (2013.01)

(58) Field of Classification Search
CPC ..... G05F 1/24; G05F 1/40; G05F 1/44; G05F 1/56; H02M 3/1582; H02M 3/135; H02M 3/156; H02M 3/158; H02M 3/155; H02M 3/157

USPC ................. 323/259, 265, 282, 283, 344, 351
See application file for complete search history.

(56) References Cited

U.S. PATENT DOCUMENTS

| | | | |
|---|---|---|---|
| 9,819,310 B2 * | 11/2017 | Wu ..................... | H03F 1/0216 |
| 2002/0109548 A1 | 8/2002 | Hosokawa | |
| 2015/0050901 A1 * | 2/2015 | Lee ..................... | H03F 1/0277 |
| | | | 455/127.3 |
| 2015/0054340 A1 | 2/2015 | Hayes et al. | |

(Continued)

FOREIGN PATENT DOCUMENTS

EP 3109986 A1 12/2016

OTHER PUBLICATIONS

Combined Search and Examination Report under Sections 17 and 18(3), UKIPO, Application No. GB1708548.1, dated Oct. 27, 2017.

(Continued)

*Primary Examiner* — Adolf D Berhane
(74) *Attorney, Agent, or Firm* — Jackson Walker L.L.P.

(57) ABSTRACT

In accordance with embodiments of the present disclosure, a system for power conversion may include a power converter comprising a power inductor and a switch coupled to the power inductor and a predriver system for electrically driving a gate of the switch, the predriver system configured to operate in a plurality of modes including a high-power mode in which the predriver system is supplied with electrical energy from a first power supply having a first supply voltage and a low-power mode in which the predriver system is supplied with electrical energy from a second power supply having a second supply voltage significantly lesser than the first supply voltage.

18 Claims, 2 Drawing Sheets

(56) References Cited

U.S. PATENT DOCUMENTS

2017/0093339 A1* 3/2017 Wu ...................... H03F 1/0216

OTHER PUBLICATIONS

International Search Report and Written Opinion of the International Searching Authority, International Application No. PCT/US2018/028865, dated Jun. 29, 2018.

* cited by examiner

US 10,230,300 B2

POWER CONVERTER PREDRIVER SYSTEM WITH MULTIPLE POWER MODES

FIELD OF DISCLOSURE

The present disclosure generally relates to integrated circuits, and, more particularly, to systems and methods for power conversion in which a predriver system of a power converter operates in multiple power modes.

BACKGROUND

Many electronic devices on the market today often use power converters to convert electric energy from one form to another (e.g., converting between alternating current and direct current), convert a voltage or current of an electrical signal, modify a frequency of an electrical signal, or some combination of the above. Examples of power converters may include boost converters and buck converters. Such power converters are often used to convert an input voltage for other circuitry, wherein such converted voltage is greater than (e.g., if a boost converter is used) or less than (e.g., if a buck converter is used) the input voltage. For example, a boosted audio amplifier may include a boost converter for converting an input source voltage to produce a supply voltage for a switched output stage (e.g., a Class D of a boost converter) of the amplifier.

SUMMARY

In accordance with the teachings of the present disclosure, certain disadvantages and problems associated with operation of a power converter have been reduced or eliminated.

In accordance with embodiments of the present disclosure, a system for power conversion may include a power converter comprising a power inductor and a switch coupled to the power inductor and a predriver system for electrically driving a gate of the switch, the predriver system configured to operate in a plurality of modes including a high-power mode in which the predriver system is supplied with electrical energy from a first power supply having a first supply voltage and a low-power mode in which the predriver system is supplied with electrical energy from a second power supply having a second supply voltage significantly lesser than the first supply voltage.

In accordance with these and other embodiments of the present disclosure, a method for power conversion may include, in a power converter comprising a power inductor and a switch coupled to the power inductor operating a predriver system for electrically driving a gate of the switch in a high-power mode in which the predriver system is supplied with electrical energy from a first power supply having a first supply voltage and operating the predriver system in a low-power mode in which the predriver system is supplied with electrical energy from a second power supply having a second supply voltage significantly lesser than the first supply voltage.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
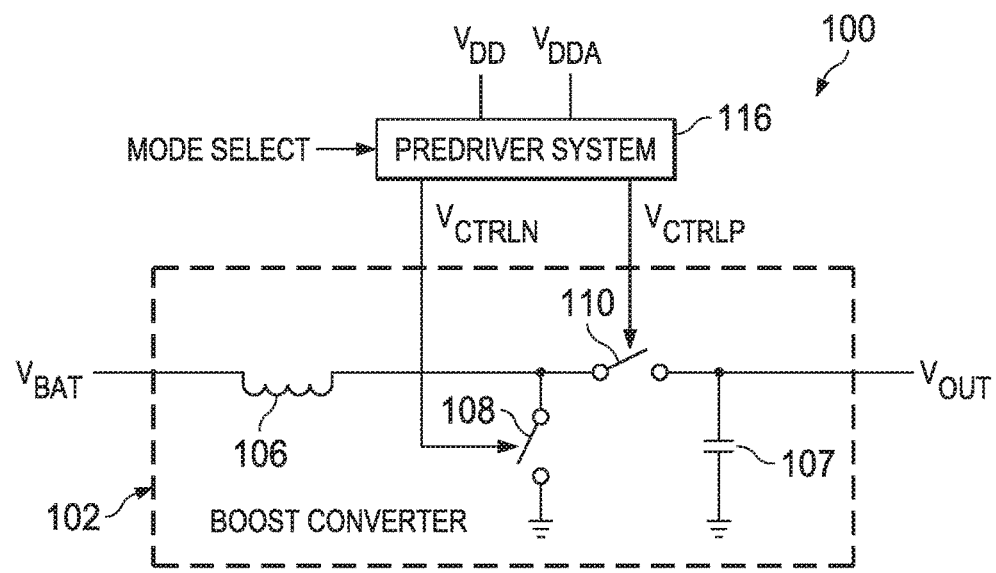
FIG. 1 illustrates an example circuit comprising a boost converter for converting an input source voltage to produce an output voltage, in accordance with embodiments of the present disclosure.

FIG. 1 illustrates an example circuit 100 comprising a boost converter 102 for converting an input source voltage $V_{BAT}$ to produce an output voltage $V_{OUT}$, in accordance with embodiments of the present disclosure. As shown in FIG. 1, boost converter 102 may comprise an inductor 106 coupled at a first terminal to an input source voltage $V_{BAT}$ and coupled at a second terminal to non-gate terminals of each of switches 108 and 110. Boost converter 102 shown in FIG. 1 may also comprise switch 108 coupled at one non-gate terminal to a ground voltage and coupled at its other non-gate terminal to inductor 106 and a non-gate terminal of switch 110, and switch 110 coupled at one non-gate terminal to inductor 106 and a non-gate terminal of switch 108 and coupled at its other non-gate terminal to a terminal of capacitor 107. Boost converter 102 shown in FIG. 1 may also include a capacitor 107 coupled between a non-gate terminal of switch 110 and a ground voltage.

As shown in FIG. 1, circuit 100 may also include a predriver system 116. Predriver system 116 may include any suitable system, device, or apparatus configured to drive a p-side control voltage $v_{CTRLP}$ to the gate terminal of switch 110 and to drive a n-side control voltage $v_{CTRLN}$ to the gate terminal of switch 108. Each of p-side control voltage $v_{CTRLP}$ and n-side control voltage $v_{CTRLN}$ may be pulse-width modulated signals. In steady-state operation, switch 108 will generally be open when switch 110 is closed, and vice versa (although, in some embodiments, a diode may be used in lieu of switch 110, wherein an anode of such diode may be coupled to inductor 106 and the cathode of such diode may be coupled to capacitor 107). When switch 108 is closed, current may flow from the voltage source generating the input source voltage $V_{BAT}$ through inductor 106, and inductor 106 may store energy. During this time, inductor 106 may have a voltage drop across it, with a positive-polarity at the terminal coupled to the input source voltage $V_{BAT}$. When switch 108 is open and switch 110 is closed, the current flowing through inductor 106 may be reduced. Such change or reduction in current may be opposed by inductor 106 and the voltage polarity of inductor 106 may reverse (e.g., with a positive-polarity at the terminal coupled to generating the input source voltage $V_{BAT}$). As a result, effectively two voltage sources are in series (input source voltage $V_{BAT}$ and the voltage across inductor 106), thus causing a voltage higher than $V_{BAT}$ to charge capacitor 107. If switches 108 and 110 are cycled fast enough, inductor 106 will not discharge fully in between charging stages, and output voltage $V_{OUT}$ on capacitor 107 will have voltage greater than that of the input source voltage $V_{BAT}$ when switch 108 is opened. Thus, output voltage $V_{OUT}$ generated by boost converter 102 may be a function of p-side control voltage $v_{CTRLP}$, n-side control voltage $v_{CTRLN}$, and the input source voltage $V_{BAT}$.

Also as shown in FIG. 1, predriver system 116 may be configured to receive a first power supply having a first supply voltage $V_{DD}$ and a second power supply having a second supply voltage $V_{DDA}$ significantly lesser than first supply voltage $V_{DD}$ (e.g., $V_{DDA} < V_{DD}$). Predriver 116 may also receive a mode select signal MODE SELECT indicative of a desired operating mode of predriver system 116. Accordingly, based on mode select signal MODE SELECT, predriver system 116 may operate in a plurality of modes including a high-power mode in which predriver system 116 is supplied with electrical energy from the first power supply with first supply voltage $V_{DD}$ and a low-power mode in which predriver system 116 is supplied with electrical energy from the second power supply with second supply voltage $V_{DDA}$. By being able to operate in a plurality of modes in this manner, when another system which is supplied power by output voltage $V_{OUT}$ is powered down or idle, operating in the low-power mode may allow boost converter 102 to stay active and continue generating a boosted output voltage $V_{OUT}$, while consuming a smaller amount of power than it would in the high-power mode.

Figure 2:
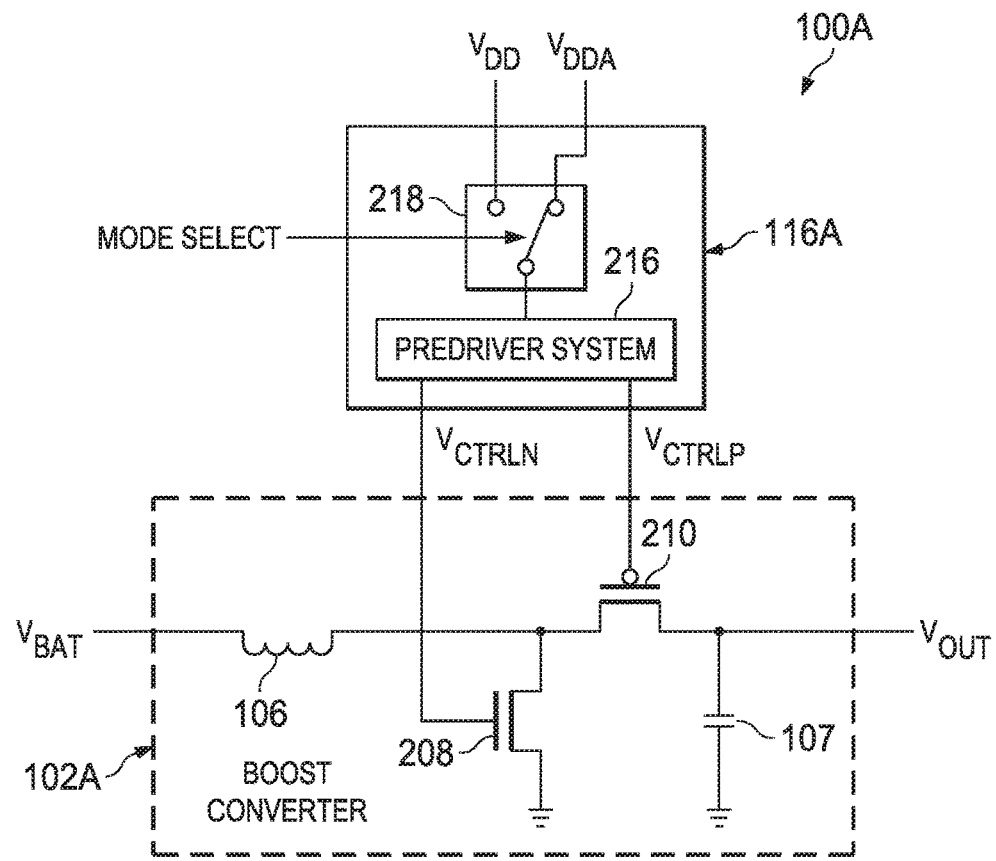
FIG. 2 illustrates an example circuit comprising a boost converter for converting an input source voltage to produce an output voltage which may be used to implement the circuit of FIG. 1, in accordance with embodiments of the present disclosure.

FIG. 2 illustrates an example circuit 100A comprising a boost converter 102A for converting an input source voltage $V_{BAT}$ to produce an output voltage $V_{OUT}$, in accordance with embodiments of the present disclosure. Circuit 100A may be used to implement circuit 100 of FIG. 1. Accordingly, boost converter 102A and predriver system 116A of FIG. 2 may be used to implement boost converter 102 and predriver system 116 of FIG. 1, respectively. As shown in FIG. 2, switch 108 of circuit 100 may be implemented in circuit 100A as a single switching element, for example, an n-type metal-oxide-semiconductor field-effect transistor (NMOSFET) 208. FIG. 2 also depicts that switch 110 of circuit 100 may be implemented in circuit 100A as a p-type metal-oxide-semiconductor field-effect transistor (PMOSFET) 210, although in some embodiments, such switch may be implemented as a diode having its anode coupled to inductor 106 and its cathode coupled to capacitor 107.

FIG. 2 further depicts that predriver system 116 of circuit 100 may be implemented with predriver system 116A having a single predriver circuit. The single predriver circuit may include a predriver subsystem 216 for driving p-side control voltage $V_{CTRLP}$ to the gate terminal of transistor 210 and driving n-side control voltage $v_{CTRLN}$ to the gate terminal of transistor 208. The single predriver circuit may also include a switch 218 configured to, based on mode select signal MODE SELECT, switch a power supply input of the single predriver circuit between the first power supply having first supply voltage $V_{DD}$ and the second power supply having second supply voltage $V_{DDA}$ such that the power supply input is coupled to the first power supply and receives first supply voltage $V_{DD}$ in the high-power mode and the power supply input is coupled to the second power supply and receives second supply voltage $V_{DDA}$ in the low-power mode. Thus, in the low-power mode, n-side control voltage $v_{CTRLN}$ may be driven to a low voltage as compared to the high-power mode, thus allowing boost converter 102A to generate boosted output voltage $V_{OUT}$ while consuming less power.

Figure 3:
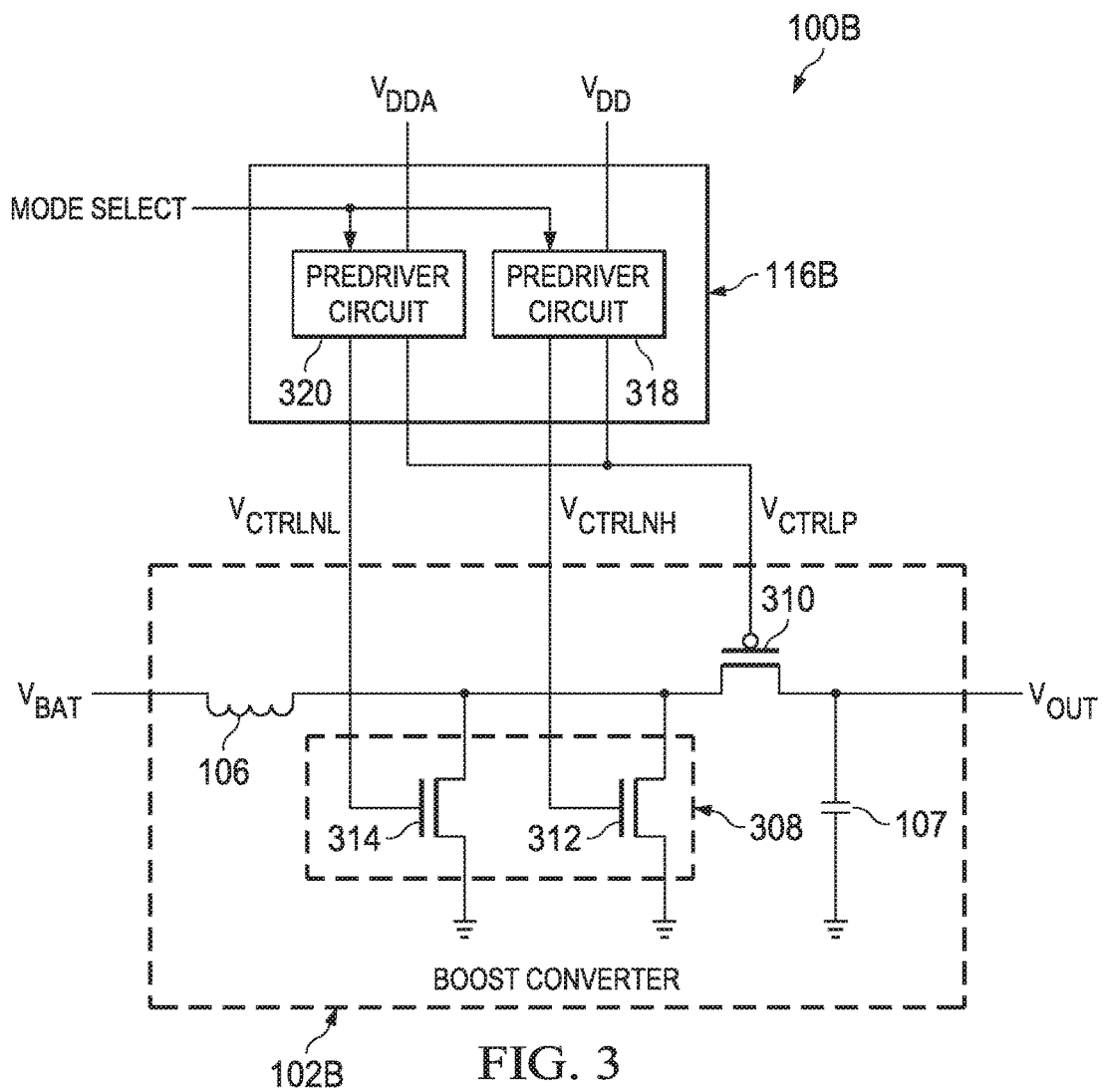
FIG. 3 illustrates another example circuit comprising a boost converter for converting an input source voltage to produce an output voltage which may be used to implement the circuit of FIG. 1, in accordance with embodiments of the present disclosure.

FIG. 3 illustrates an example circuit 100B comprising a boost converter 102B for converting an input source voltage $V_{BAT}$ to produce an output voltage $V_{OUT}$, in accordance with embodiments of the present disclosure. Circuit 100B may be used to implement circuit 100 of FIG. 1. Accordingly, boost converter 102B and predriver system 116B of FIG. 3 may be used to implement boost converter 102 and predriver system 116 of FIG. 1, respectively. As shown in FIG. 3, switch 108 of circuit 100 may be implemented in circuit 100B as a switch 308 comprising a plurality of switching elements, for example, a first switching element comprising a first metal-oxide-semiconductor field-effect transistor 312 and the second switching element comprising a second metal-oxide-semiconductor field-effect transistor 314. Also as depicted in FIG. 3, first metal-oxide-semiconductor field-effect transistor 312 and second metal-oxide-semiconductor field-effect transistor 314 may be coupled in parallel in that respective non-gate terminals of each of first metal-oxide-semiconductor field-effect transistor 312 and second metal-oxide-semiconductor field-effect transistor 314 may be coupled together. FIG. 3 also depicts that switch 110 of circuit 100 may be implemented in circuit 100B as a p-type metal-oxide-semiconductor field-effect transistor 310, although in some embodiments, such switch may be implemented as a diode having its anode coupled to inductor 106 and its cathode coupled to capacitor 107.

FIG. 3 further depicts that predriver system 116 of circuit 100 may be implemented with predriver system 116B having a plurality of predriver circuits comprising first predriver circuit 318 and second predriver circuit 320. First predriver circuit 318 may be configured to electrically drive a gate of first metal-oxide-semiconductor field-effect transistor 312, and first predriver circuit 318 may have a first power supply input coupled to the first power supply with first supply voltage $V_{DD}$ such that first predriver circuit 318 operates from first supply voltage $V_{DD}$ in order to drive the gate of first metal-oxide-semiconductor field-effect transistor 312 with a first n-side control voltage $v_{CTRLNH}$ in the high-power mode. Similarly, second predriver circuit 320 may be configured to electrically drive a gate of second metal-oxide-semiconductor field-effect transistor 314, and second predriver circuit 320 may have a second power supply input coupled to the second power supply with second supply voltage $V_{DDA}$ such that second predriver circuit 320 operates from second supply voltage $V_{DDA}$ in order to drive the gate of second metal-oxide-semiconductor field-effect transistor 314 with a second n-side control voltage $v_{CTRLNL}$ in the low-power mode, wherein second n-side control voltage $v_{CTRLNL}$ is substantially smaller than first n-side control voltage $v_{CTRLNH}$. Thus, in the low-power mode, second n-side control voltage $v_{CTRLNL}$ may be driven to a metal-oxide-semiconductor field-effect transistor and first n-side control voltage $v_{CTRLNH}$ may be driven to another parallel metal-oxide-semiconductor field-effect transistor in the high-power mode, thus allowing boost converter 102B to generate boosted output voltage $v_{OUT}$ in the low-power mode while consuming less power.

Although FIGS. 1-3 above and the description thereof contemplate use of a predriver system in connection with a boost converter, it is understood that the systems and methods described herein may be generally applicable to and usable by systems having power converters other than a boost converter, such as a buck converter and a buck-boost converter, as non-limiting examples.

As used herein, when two or more elements are referred to as "coupled" to one another, such term indicates that such two or more elements are in electronic communication whether connected indirectly or directly, without or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosures have been described in detail, it should be understood that various changes, substitutions, and alterations could be made hereto without departing from the spirit and scope of the disclosure.

What is claimed is:

1. A system for power conversion, comprising:
   a power converter comprising a power inductor and a switch coupled to the power inductor; and
   a predriver system for electrically driving a gate of the switch, the predriver system configured to operate in a plurality of modes including:
      a high-power mode in which the predriver system is supplied with electrical energy from a first power supply having a first supply voltage; and
      a low-power mode in which the predriver system is supplied with electrical energy from a second power supply having a second supply voltage significantly lesser than the first supply voltage.

2. The system of claim 1, wherein:
   the switch comprises a single switching element;
   the predriver system comprises a single predriver circuit for electrically driving a gate of the single switching element; and
   the single predriver circuit comprises a second switch for switching a power supply input of the single predriver circuit between the first power supply and the second power supply such that the power supply input is coupled to the first power supply in the high-power mode and the power supply input is coupled to the second power supply in the low-power mode.

3. The system of claim 2, wherein the single switching element comprises a field-effect transistor.

4. The system of claim 2, wherein the single switching element comprises an n-type field-effect transistor.

5. The system of claim 1, wherein:
   the switch comprises a first switching element and a second switching element; and
   the predriver system comprises:
      a first predriver circuit for electrically driving a gate of the first switching element, the first predriver circuit having a first power supply input coupled to the first power supply and configured to drive the gate of the first switching element in the high-power mode; and
      a second predriver circuit for electrically driving a gate of the second switching element, the second predriver circuit having a second power supply input coupled to the second power supply and configured to drive the gate of the second switching element in the low-power mode.

6. The system of claim 5, wherein non-gate terminals of the first switching element and the second switching element are coupled in parallel.

7. The system of claim 5, wherein the first switching element comprises a first field-effect transistor and the second switching element comprises a second field-effect transistor.

8. The system of claim 5, wherein the first switching element comprises a first n-type field-effect transistor and the second switching element comprises a second n-type field-effect transistor.

9. The system of claim 1, wherein the power converter comprises a boost converter.

10. A method for power conversion, comprising, in a power converter comprising a power inductor and a switch coupled to the power inductor:
    operating a predriver system for electrically driving a gate of the switch in a high-power mode in which the predriver system is supplied with electrical energy from a first power supply having a first supply voltage; and
    operating the predriver system in a low-power mode in which the predriver system is supplied with electrical energy from a second power supply having a second supply voltage significantly lesser than the first supply voltage.

11. The method of claim 10, wherein:
    the switch comprises a single switching element;
    the predriver system comprises a single predriver circuit for electrically driving a gate of the single switching element; and
    the method further comprises switching a power supply input of the single predriver circuit between the first power supply and the second power supply such that the power supply input is coupled to the first power supply in the high-power mode and the power supply input is coupled to the second power supply in the low-power mode.

12. The method of claim 11, wherein the single switching element comprises a field-effect transistor.

13. The method of claim 11, wherein the single switching element comprises an n-type field-effect transistor.

14. The method of claim 10, wherein:
    the switch comprises a first switching element and a second switching element;
    the method further comprises:
       electrically driving a gate of the first switching element with a first predriver circuit, the first predriver circuit having a first power supply input coupled to the first power supply and configured to drive the gate of the first switching element in the high-power mode; and
       electrically driving a gate of the second switching element with a second predriver circuit, the second predriver circuit having a second power supply input coupled to the second power supply and configured to drive the gate of the second switching element in the low-power mode.

15. The method of claim 14, wherein non-gate terminals of the first switching element and the second switching element are coupled in parallel.

16. The method of claim 14, wherein the first switching element comprises a first field-effect transistor and the second switching element comprises a second field-effect transistor.

17. The method of claim 14, wherein the first switching element comprises a first n-type field-effect transistor and the second switching element comprises a second n-type field-effect transistor.

18. The method of claim 10, wherein the power converter comprises a boost converter.

* * * * *